United States Patent
Nguyen et al.

(10) Patent No.: US 7,015,721 B2
(45) Date of Patent: Mar. 21, 2006

(54) PUSH-PULL OUTPUT DRIVER

(75) Inventors: Huy M. Nguyen, San Jose, CA (US); Benedict Lau, San Jose, CA (US); Roxanne Vu, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/925,544

(22) Filed: Aug. 24, 2004

(65) Prior Publication Data

US 2005/0057278 A1 Mar. 17, 2005

Related U.S. Application Data

(62) Division of application No. 10/020,921, filed on Dec. 19, 2001, now Pat. No. 6,781,416.

(51) Int. Cl.
*H03K 19/0175* (2006.01)

(52) U.S. Cl. .......................................... 326/83; 326/86
(58) Field of Classification Search .................. 326/37, 326/38, 82–90
See application file for complete search history.

(56) References Cited

U.S. PATENT DOCUMENTS

| | | | |
|---|---|---|---|
| 5,309,035 A | 5/1994 | Watson, Jr. et al. | |
| 5,598,119 A | 1/1997 | Thayer et al. | |
| 5,811,997 A * | 9/1998 | Chengson et al. | 327/112 |
| 5,959,481 A | 9/1999 | Donnelly et al. | |
| 6,009,487 A | 12/1999 | Davis et al. | |
| 6,047,356 A | 4/2000 | Anderson et al. | |
| 6,094,075 A | 7/2000 | Garrett, Jr. et al. | |
| 6,118,310 A | 9/2000 | Esch, Jr. | |
| 6,163,178 A | 12/2000 | Stark et al. | |
| 6,198,307 B1 | 3/2001 | Garlepp et al. | |
| 6,326,802 B1 | 12/2001 | Newman et al. | |
| 6,342,800 B1 | 1/2002 | Stark et al. | |
| 6,392,437 B1 * | 5/2002 | El-Ayat | 326/39 |
| 6,448,813 B1 | 9/2002 | Garlepp et al. | |
| 6,462,488 B1 | 10/2002 | Van Lieshout | |
| 6,462,588 B1 | 10/2002 | Lau et al. | |
| 6,462,591 B1 | 10/2002 | Garrett, Jr. et al. | |
| 6,516,365 B1 | 2/2003 | Horowitz et al. | |
| 6,583,644 B1 | 6/2003 | Shin | |
| 6,618,786 B1 | 9/2003 | Sidiropoulos et al. | |
| 6,661,268 B1 | 12/2003 | Stark et al. | |
| 6,684,263 B1 | 1/2004 | Horowitz et al. | |
| 6,684,285 B1 | 1/2004 | Farmwald et al. | |
| 6,772,351 B1 | 8/2004 | Werner et al. | |
| 6,781,416 B1 | 8/2004 | Nguyen et al. | |
| 2003/0058008 A1 * | 3/2003 | Taguchi et al. | 327/112 |
| 2004/0027179 A1 * | 2/2004 | Jang | 327/112 |

* cited by examiner

*Primary Examiner*—Don Le
(74) *Attorney, Agent, or Firm*—Morgan, Lewis & Bockius LLP

(57) ABSTRACT

An improved, open-loop push-pull driver is described. Closed-loop feedback loop techniques for control of the push-pull driver are described. These techniques are particularly well adapted to control shoot-through current in a push-pull driver circuit.

20 Claims, 9 Drawing Sheets

PUSH-PULL OUTPUT DRIVER

This application is a divisional of U.S. patent application Ser. No. 10/020,921, filed Dec. 19, 2001, now U.S. Pat. No. 6,781,416, which is incorporated by reference herein in its entirety.

FIELD OF THE INVENTION

The present invention relates to drive circuits (or drivers). More particularly, the present invention defines an improved push-pull driver having edge conditioning and non-overlap control. The present invention further describes circuits and techniques for actively tuning the output of a push-pull driver.

BACKGROUND OF THE INVENTION

Push-pull circuits are well known and have been adapted to digital and analog applications as varied as stepping motor control, audio loudspeakers, and memory systems. In the present context, push-pull circuits have been used in bus systems including one or more devices that output data onto a common bus. As used throughout, the term "bus" refers to one or more conductive paths communicating electrical signals between two points.

Push-pull circuits have excellent drive characteristics. That is, push-pull circuits routinely provide clean rising and falling edges for high speed data signals being driven onto a bus. This capability is realized by effective control of two stages generically illustrated in Figure (FIG.) 1.

In FIG. 1, a push-pull drive circuit is shown as implemented in CMOS and comprises a PMOS-transistor first stage 1 and NMOS-transistor second stage. In theory, the effective switching of the first and second stages controls a current path between a voltage source (Vss) and ground. Ideal switching by the input signal 3 of ideal first and second stages (i.e., perfectly sized and implemented CMOS devices) produces an ideal output signal 4, shown as curve "A" in the graph of FIG. 2. The production of this ideal output signal requires an exact actuation timing relationship between the first and second stages of the push-pull driver. This relationship requires that the switching input signals turn OFF one stage of the push-pull driver while simultaneously turning ON the other stage.

However, as one would expect, process variations in the fabrication of the first and second stage CMOS devices, as well as variations in device performance due to operating voltage and temperature variations, (collectively and generically referred to hereafter as "PVT" for process, voltage and temperature), result in very different output curves. For example, curve "B" shown in FIG. 2 illustrates an occurrence in which both stages of the push-pull driver are simultaneously OFF and a voltage knee momentarily forms in the output signal before one of the stages turns ON. Curve "C" in FIG. 2 illustrates an occurrence in which both stages of the push-pull driver are simultaneously ON and current momentarily "shoots-through" the channel between $V_{ss}$ and ground.

In a digital system, this shoot-through phenomenon is well understood and results in considerable noise being transmitted onto the bus, absent some design remedy. Historically the remedy has come in the form of a large by-pass capacitor shunting the shoot-through current to a ground plane in the CMOS substrate. Unfortunately, as bus systems are required to run at ever increasing data rates this brute force method of dealing with shoot-through becomes less and less acceptable. This is particularly true where bus widths are wide and where data signals are driven onto the bus using multiple clocks and/or multiple clock edges.

Many conventional double-data-rate ("DDR") memory systems use push-pull drivers to communicate data between bus system devices and the bus. This approach differs from other bus systems having integrated circuit using simpler, open-drain output drivers. As DDR memory systems and similar data communication systems push the envelop for high-speed data transfer, push-pull shoot-through noise and the corresponding charge dump via by-pass capacitors becomes increasing unacceptable.

It is further understood that by placing a "pre-driver circuit" in front of a push-pull driver performance of the push-pull driver may be enhanced. Looking at the simplified circuit shown in FIG. 3 as an example, an adjustable pre-driver 20 precedes the push-pull driver 21. This combination is shown in greater detail in FIG. 4, wherein the push-pull driver is formed by the combination of P0 and N0 connected between a voltage source and ground.

Conventionally, selected control signals sampled from the pre-driver circuit are used to monitor (or sense) the integrity of the switching signal(s) applied to the push-pull driver. For example, by comparing the timing of a voltage waveform taken at point—A—in the PMOS driver 22 of FIG. 4 with the timing of a voltage waveform taken at point—A'—in the NMOS driver 23 of FIG. 4, one may roughly understand the quality of the switching signals. However, such pre-driver sensing techniques do not account for PVT affects at the PMOS and NMOS output transistors. Nor does pre-driver sensing detect or address the problem of shoot-through.

SUMMARY OF EMBODIMENTS

At a minimum, performance of the conventional push-pull driver would be greatly benefited from edge conditioning and/or improved non-overlap protection. Performance of the conventional push-pull driver would also be enhanced by providing slew rate control.

Edge conditioning prevents undershoot and overshoot at the terminal stages of the output waveform. The term "overlap" refers to the condition where both stages of the push-pull driver are ON (or conductive) and shoot-through occurs. Thus, non-overlap is a desired performance characteristic since shoot-through results in increased substrate (or backplane) noise and increased supply noise. Furthermore, shoot-through creates a requirement for larger by-pass capacitors. Increased by-pass capacitor size may result in a larger overall die size. Additionally, shoot-through results in increased power (and heat) dissipation within the semiconductor device.

The present invention provides greater non-overlap control, thus eliminating shoot-through. Power is conserved, as power previously lost to shoot-through is now applied to driving the output load. The number and/or size of by-pass capacitors may be reduced and die size saved, accordingly. Power (P=I*Vds) is further conserved because the present invention provides faster output transitions by applying a boot-strap circuit utilizing positive feedback.

In another aspect, the present invention provides an actively tuned, CMOS, push-pull driver. Conventional push-pull drivers are generally open loop systems. That is, they sense and set, or periodically adjust, rather than actively monitor and control. The conventional approaches to shoot-through control or skew rate adjustment, which tend to be complicated yet imprecise, are also not scalable with frequency.

In one aspect, the present invention uses a process detector to form a control loop by which shoot-through is prevented and skew rate is controlled. The process detector may take many forms, but as presently preferred a Delay Lock Loop (DLL) is used. Many high speed bus systems already incorporate DLLs or PLLs to adjust clock signals in relation to a fixed frequency reference. By advantageously using an existing set of DLL reference signals, a control loop may be implemented which tracks and adjusts slew rate on a clock cycle by clock cycle basis.

Thus, a closed loop, shoot-through control, feedback loop may be implemented which actively tunes the switching signals in a push-pull driver. The closed loop may be implemented with a filter or delay constant capable of being digitally adjusted. The closed loop feedback sensing points may be implemented with adjustable gain.

The approach taken by the present invention to shoot-through control and slew rate tracking is scalable with frequency. Where a DLL is used as a process detector, timing skews may be controlled by digitally adding or subtracting value(s) from a digital code derived from the DLL reference signals.

By the means set forth above, and as further explained in the brief description of the presently preferred embodiments which follows, the present invention provides slew rate control and shoot-through protection, along with the associated benefits already described.

Within these broad design objectives, one embodiment of the present invention provides a push-pull driver circuit, comprising an NMOS output transistor and PMOS output transistor connected between a voltage source and ground. The respective drains of the NMOS and PMOS output transistors are commonly connected to a driver circuit output terminal. An NMOS predriver transistor is used to drive the NMOS output transistor in response to a transmit signal being applied to the NMOS pre-driver transistor through a drive signal path. The push-pull driver circuit also comprises a non-overlap circuit defining a non-overlap signal path for the transmit signal being applied to the NMOS pre-driver transistor. The delay through the non-overlap signal path is less than the delay through the drive signal path.

Alternatively, the push-pull driver circuit may include a boot-strap circuit defining a boot-strap signal path for the transmit signal being applied to the NMOS pre-driver transistor. Here, the delay through the boot-strap path is greater than the delay through the non-overlap signal path and less than the delay through the drive signal path.

In another embodiment, the present invention comprises a push-pull output driver having an output driver current path comprising a NMOS drive transistor and a PMOS drive transistor connected between a voltage source and ground. The push-pull output driver also includes a reference element. A process detector, including a process detector reference element, provides at least one control signal defining a switching signal for the push-pull output driver. A feedback circuit is used to indicate current shoot-through current occurring in the push-pull output driver and to provide a feedback control signal. Based on the feedback signal, a control circuit modifies the switching signal. Of note, the output driver reference element and the process detector element will respond similarly to variations in fabrication processes for the circuit, as well as operating temperature and operating voltage.

The process detector is preferably a delay lock loop (DLL) and the control signal is one or more digital codes derived from the DLL.

In yet another embodiment, the present invention provides a method of defining performance for a push-pull driver circuit having an output driver current path comprising a first output transistor and a second output transistor connected between a voltage source and ground. The method defines a transmission switching signal for the first and second output transistors, detects shoot-through in the output driver current path, generates a feedback signal in response to a detection of shoot-through in the output driver current path, and modifies the transmission switching signal in response to the feedback signal.

In still another embodiment, the present invention provides an output driver circuit including a PMOS output transistor having a source connected to a voltage source and a drain connected to an output terminal, and an NMOS output transistor having source connected to ground and a drain connected to the output terminal. A pre-driver circuit is associated with the output driver circuit and is operable in one of two modes. A first mode applies a transmit signal to the PMOS output transistor and the NMOS output transistor to form a push-pull output driver circuit. The second mode applies the transmit signal to only the NMOS output transistor to form an open-gate NMOS driver circuit.

In yet another embodiment, the present invention provides a method of defining performance in a push-pull driver comprising a first output transistor and a second output transistor and an output driver current path between the first and second output transistors. The method defines digital control codes in relation to a process detector, where the process detector exhibits performance characteristics which track the performance characteristics of the first and second output transistors, and thereafter defines a transmission switching signal for at least one of the first and second output transistors in relation to the digital control codes.

Shoot-through is detected in the output driver current path and a feedback signal is generated in response to a detection of shoot-through in the driver current path. Finally, the digital control codes are modified in response to the feedback signal.

In still another embodiment, the present invention provides a method of controlling shoot-through current in a push-pull driver circuit. The method defines a transmission switching signal for the push-pull driver circuit in relation to a control signal received from a process detector, adjusts the control signal to thereby modify the transmission switching signal until a shoot-through crossover point is determined at which no shoot-through current occurs in the push-pull driver circuit. Upon determining the shoot-through crossover point, the control signal is periodically dithered to re-introduce shoot-through current. Once shoot-through current is reintroduced, the control signal is again adjusted to modify the transmission switching signal until a new shoot-through crossover point is determined at which no shoot-through current occurs in the push-pull driver circuit.

In the description which follows, several examples of the present invention are presented. These are just selected examples. Modifications and adaptations of theses examples will be readily apparent to those of ordinary skill in the art. While the examples teach the present invention, the invention is broader than the examples and is defined by the attached claims.

DETAILED DESCRIPTION OF EMBODIMENTS

Figure 4:
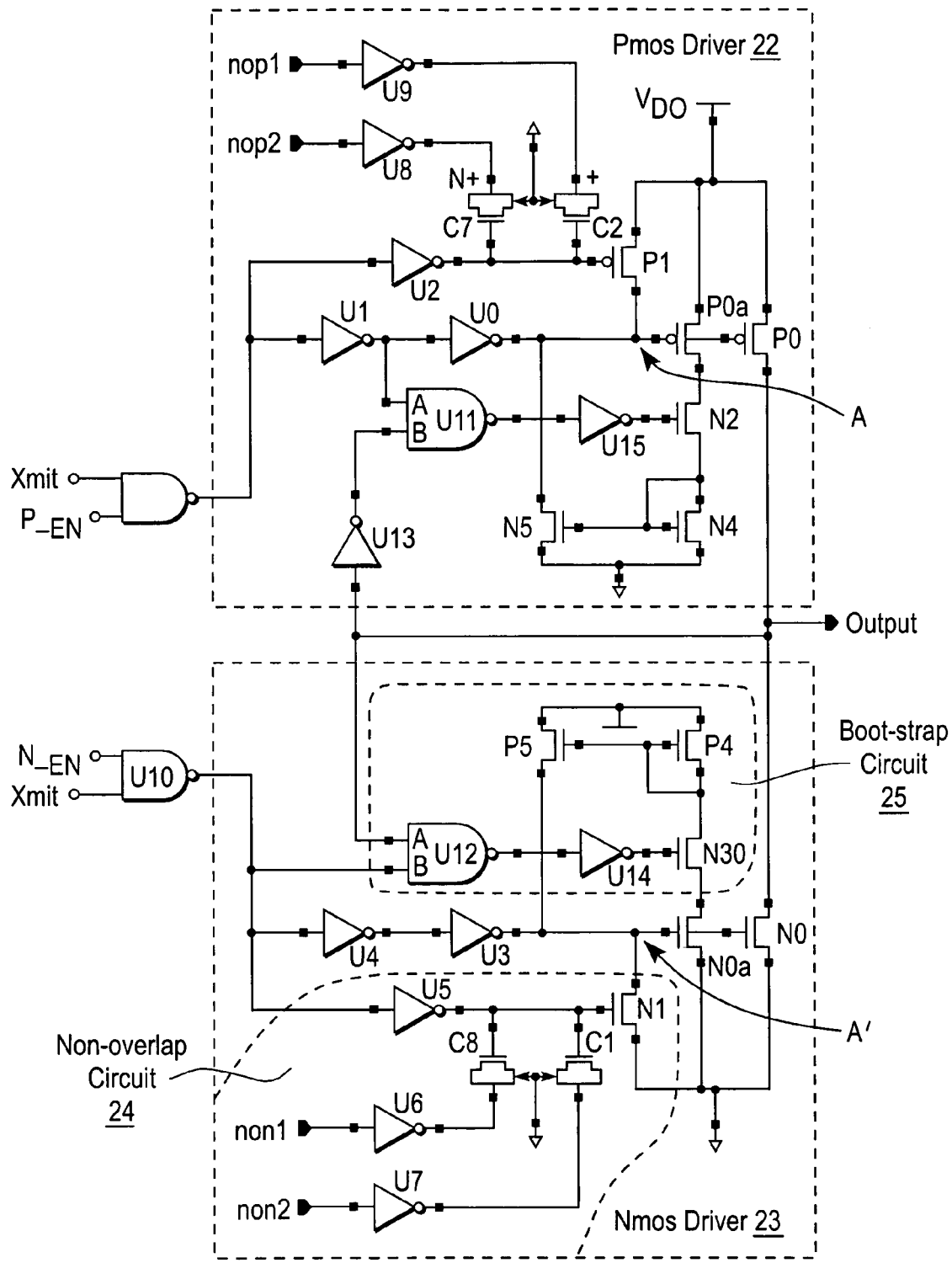
FIG. 4 illustrates one presently preferred embodiment of the subject invention.

FIG. 4 illustrates one embodiment of the present invention and includes the combination of a pre-driver circuit and a push-pull driver. The push-pull driver portion of the circuit comprises the combination of PMOS transistor P0 and NMOS transistor N0 connected between voltage source $V_{DD}$ and ground. The remainder of the circuit shown in FIG. 4 is one example of an improved pre-driver circuit designed according to the dictates of the present invention. This particular embodiment follows the conventional approach of open loop control for the push-pull driver. No voltage waveform sensing is used, but timing relationships established by a process detector, such as a DLL, are used to provide improved non-overlap protection.

Of note, the PMOS driver 22 and NMOS driver 23 are open drain structures. When connected in series, (i.e., when connecting the drains of PMOS driver 22 and NMOS driver 23, and connecting PMOS driver 22 to VDD and NMOS driver 23 to ground), PMOS driver 22 and NMOS driver 23 form a push-pull type driver capable of producing a full, rail-to-rail, push-pull signal. The Non-overlap circuit 24 and the Bootstrap circuit 25 must be enabled for optimal performance. These two circuits aid in eliminating shoot-through and accelerating the "first half" of the output signal transition. (See, FIG. 5). In addition, operation of Non-overlap circuit 24 and Bootstrap circuit 25 tend to smooth the latter edge portion of the output signal. When this circuit is used in push-pull mode, the strength of the P/N devices should preferably revert to a predetermined default value typically established by a controller. This predetermined default value is defined by the system designer in relation to transmission characteristics of the bus. Alternatively, a duty cycle "skew" register may be poled by the controller to determine strength settings for the PMOS and NMOS devices when these devices are used in push-pull mode. This is particularly true where the pre-driver duty cycle is dramatically skewed for the open drain output drivers due to nature of the passive bus termination. That is, the rising edge of the output signal is typically pulled up by the termination resistor while the falling edge of the output signal is pulled down by the open drain driver against the pull up termination resistor and other loads on the bus.

Of further note, one of ordinary skill in the art will recognize that signaling for typical bus systems using open drain drivers is small swing where the driver strength is carefully calibrated using one of several known current control adjustment circuits. Where the present invention is adapted to such bus systems, the current control adjustment circuit should be bypassed, and duty cycle skew should be readjusted to the default value when the driver is used in a push-pull fashion.

Looking at FIG. 4, several delay paths are particularly relevant to the example. The shortest delay path is through non-overlap circuit 24. This path connects U10, U5, and NI. When the transmit (Xmit) signal is applied to the pre-driver circuit in FIG. 4, it reaches through Non-overlap circuit 24 to turn the pre-driver transistor N0a OFF, thus preventing shoot-through by enforcing a break-before-make condition. Control signals non1 and non2 may be actuated to fine tune the this non-overlap function. As presently preferred, these two control signals are externally driven and typically derived as part of a special test mode which determines noise profile of the bus.

The delay path (connecting U10, U12, U14, and N3) through boot-strap circuit 25 is longer than the delay path through non-overlap circuit 24, but is shorter than the delay path through the pre-driver (connecting U10, U4, U3, and N0). In relation to boot-strap circuit 25, transistor N0a senses the current ON/OFF state of drive transistor NO. As the output signal level rises, it is sensed at terminal A of gate U12. At a defined "trip-point" voltage threshold at terminal A, gate U12 closes. This trip point may be defined and adjusted by adding capacitors (not shown) to the signal path, thereby prolonging the bootstrap time. The combination of transistors P4, P5, N3a, and N0a form a current pump circuit. As can be seen in FIG. 4, this particular construction of the current pump circuit is essentially a positive feedback loop that pumps current into the gate capacitor of drive transistor N0, thereby accelerating the turn ON speed of the device.

Transistor N3a serves as an ON/OFF switch for boot-strap circuit 25. As can be seen upon consideration of the operation of boot-strap circuit 25, it only boosts the initial half of the output signal transition edge. The latter half is not boosted. This variable assist prevents overshoot during transition of the output signal. Reduced overshoot smoothes the edge of the final state of the output signal. The strength of the presently preferred boot-strap circuit 25 may be adjusted by defining the ratio of transistor P4 to P5. The sensitivity of the boot-strap circuit may be adjusted by defining the ratio of N0 to N0a.

Figure 5:
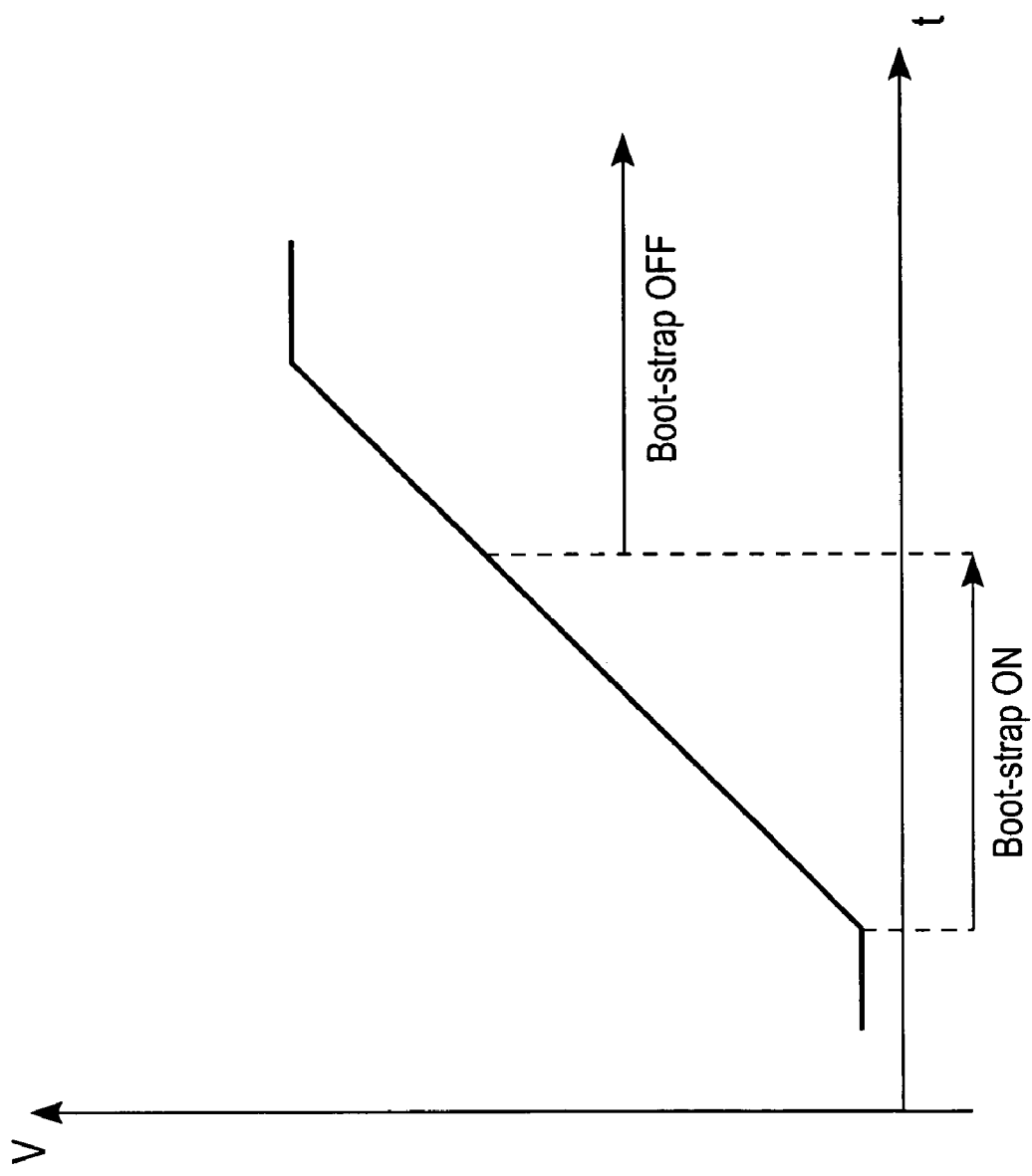
FIG. 5 illustrates action of the boot-strap circuit upon an idealized output waveform.

FIG. 5 illustrates, using an idealized waveform, the time-wise contribution of boot-strap circuit 25 to the rising output voltage waveform. During the first half of the rising waveform edge, the Boot-strap circuit is ON and boosts development of the waveform transition. As described above, at a point defined by a switching element (transistor N3a in the example of FIG. 4), the boot-strap circuit is turned OFF to avoid overshoot.

Figure 6A:
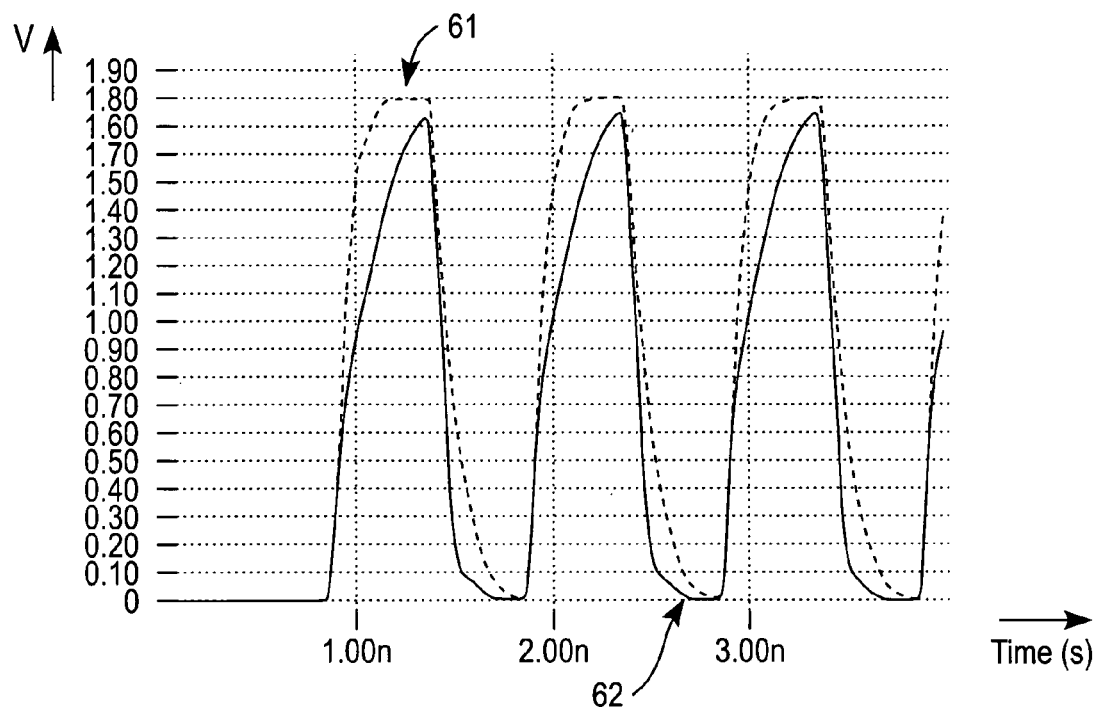
FIGS. 6A, 6B, 7A, and 7B are waveform diagrams illustrating performance improvements between the present invention and conventional push-pull drivers.
Figure 6B:
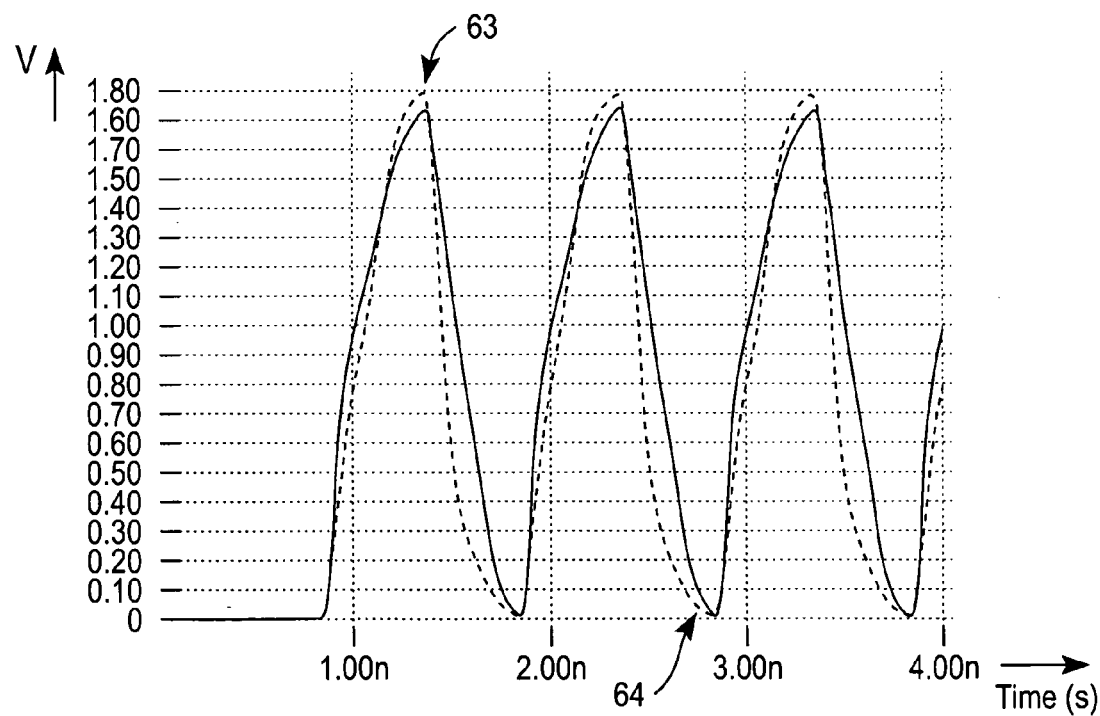

The operational benefits afforded by the present invention may be better understood by considering the comparative voltage and current waveforms shown in FIGS. 6A/6B, and 7A/7B. FIGS. 6A and 6B compare gate voltages at transistors P0 and N0 as a function of time for the improved push-pull circuit (6A) and the conventional push-pull circuit (6B). The solid line in the respective graphs tracks the gate voltage at N0 and the dashed line tracks the gate voltage at P0. Of note, point 61 in the waveforms of FIG. 6A clearly shows complete turn OFF of P0 and point 62 shows complete turn OFF of N0. Compare these point to the corresponding points 63 and 64 in the waveforms of FIG. 6B, where P0 and N0 are barely turned OFF before switching.

Figure 7A:
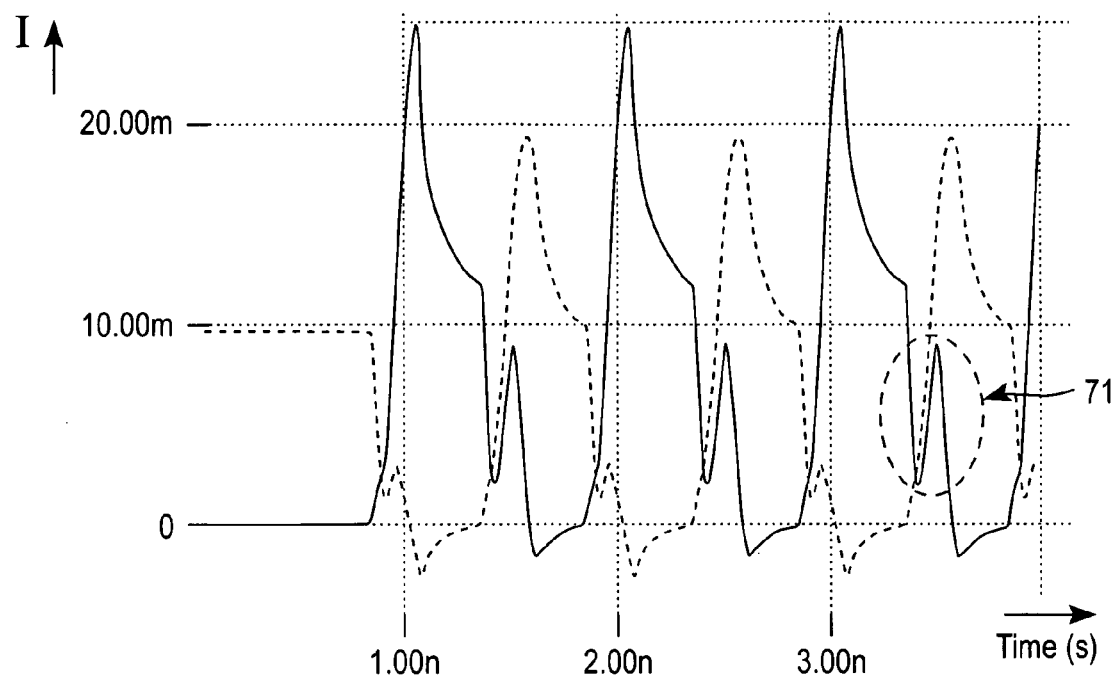
Figure 7B:
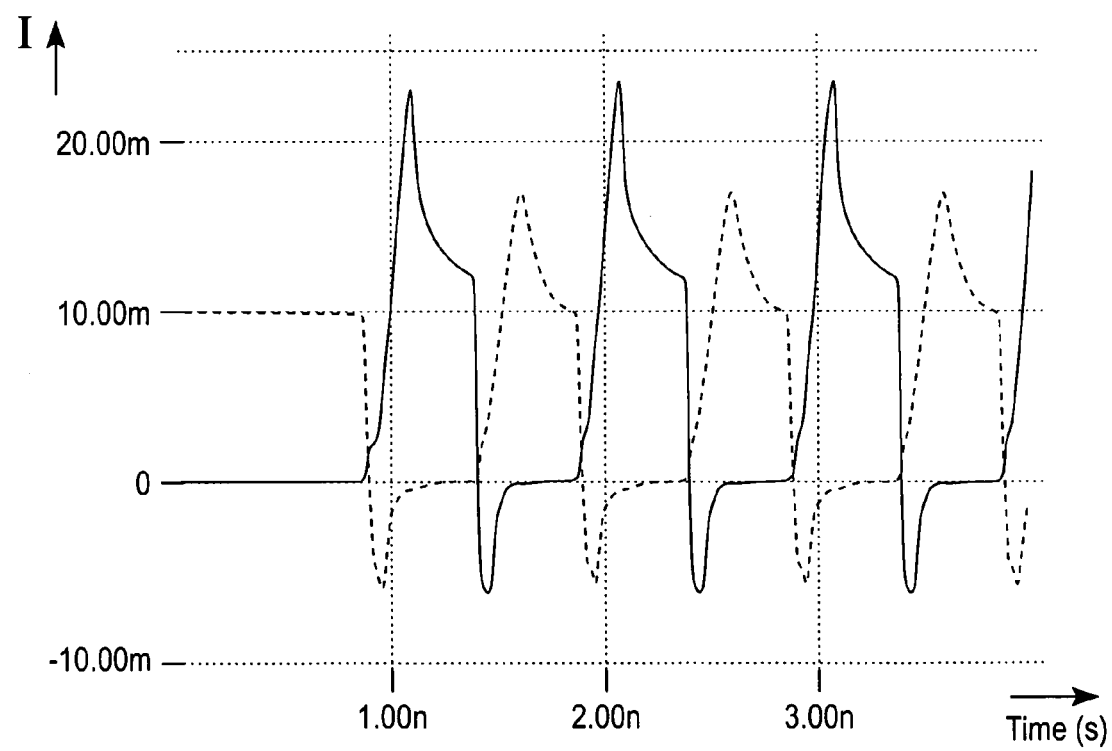

The effect of these respective gate voltage switching signals is shown in FIGS. 7A and 7B. FIG. 7A shows the current passing through the drive transistors of the conventional push-pull circuit. Note the shoot-through current highlighted in region 71 of the current waveform. By way of comparison, the non-overlap and bootstrap features of the first embodiment of the present invention prevent shoot-through in the current waveforms for the improved push-pull circuit, as shown in FIG. 7B.

The push-pull circuit shown in FIG. 4 offers an additional capability. As discussed above, many existing bus systems, for example synchronous single data rate memory systems, make use of open-drain drivers, rather than the more complicated push-pull drivers. As a result, companies providing legacy open-drain driver boards and more advanced push-pull driver boards are forced to manufacture and stock separate products lines divided along driver type.

The increased cost of carrying separate product lines can be eliminated by the present invention. If the PMOS driver 22 of the circuit shown in FIG. 4 is disabled, by means of the control signal P_$_{EN}$ in the example shown in FIG. 4, the NMOS driver 23 may be used as an open-drain NMOS driver. When used in this configuration, the non-overlap circuit 24 should be disabled, since shoot-through will no longer be a problem and use of non-overlap circuit 24 may adversely alter the duty cycle timing of conventional bus systems using open-drain drivers. However, the benefits of boot-strap circuit 25 remain. The boot-strap function enhances the transmit duty cycle by speeding up the normally slower falling edge inherit in many conventional bus system transmission schemes.

Thus, the circuit of FIG. 4 may be used to replace legacy, open-drain drivers, or to provide an improved push-pull driver.

However, like conventional push-pull drivers, the exemplary push-pull driver shown in FIG. 4 is an open-loop circuit. Considerable additional benefits may be achieved by use of a closed loop, push-pull driver circuit. In another aspect, the present invention provides a closed-loop driver circuit that prevents shoot-through and tracks slew rate. As presently preferred, closed loop control is digitally provided using the capability of a process detector, such as a DLL or PLL.

Figure 1:
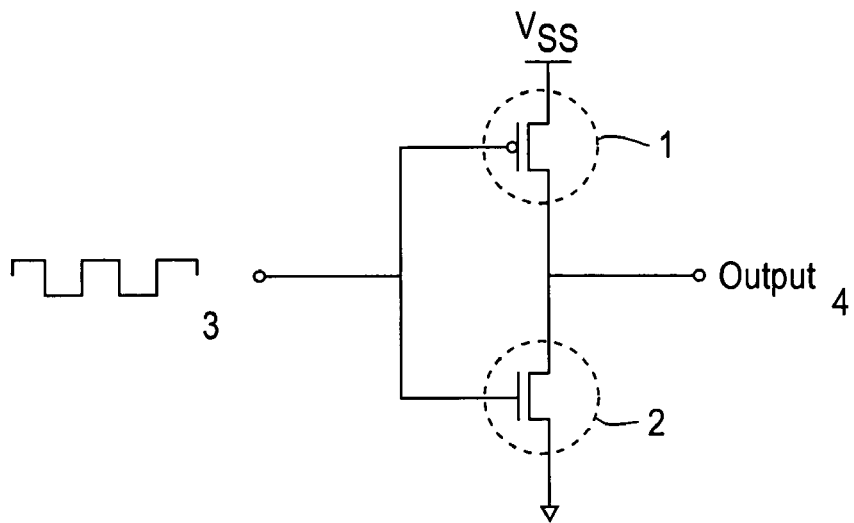
FIG. 1 illustrates an ideal, conventional push-pull driver.
Figure 2:
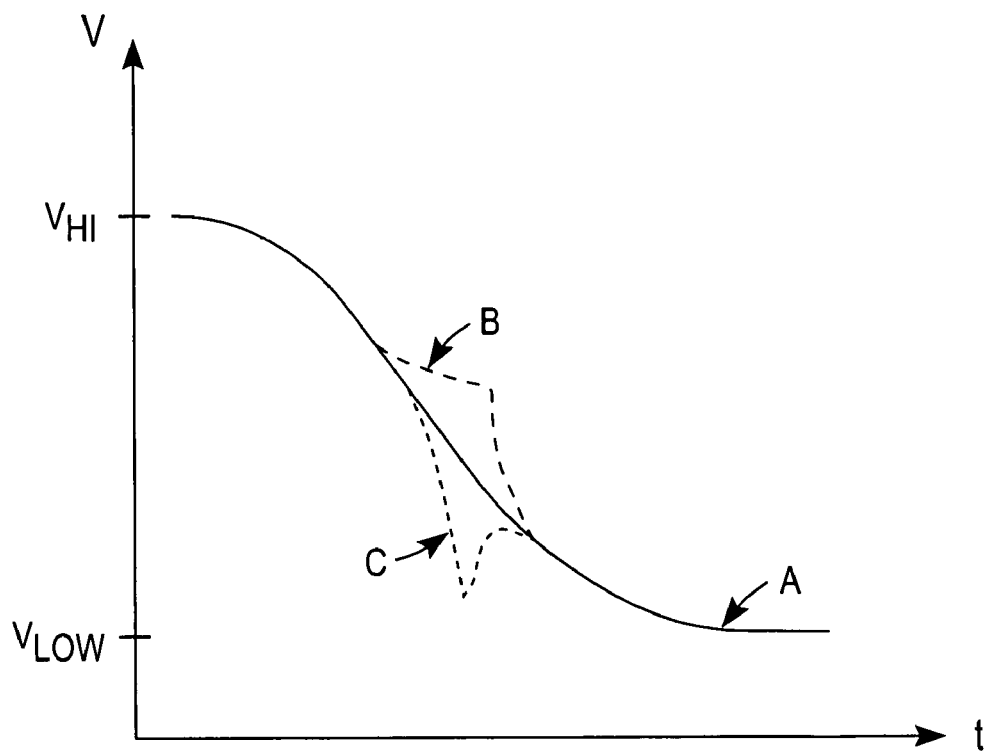
FIG. 2 compares an output waveform from an ideal push-pull driver to erroneous output waveforms commonly produced by actual push-pull drivers.
Figure 3:
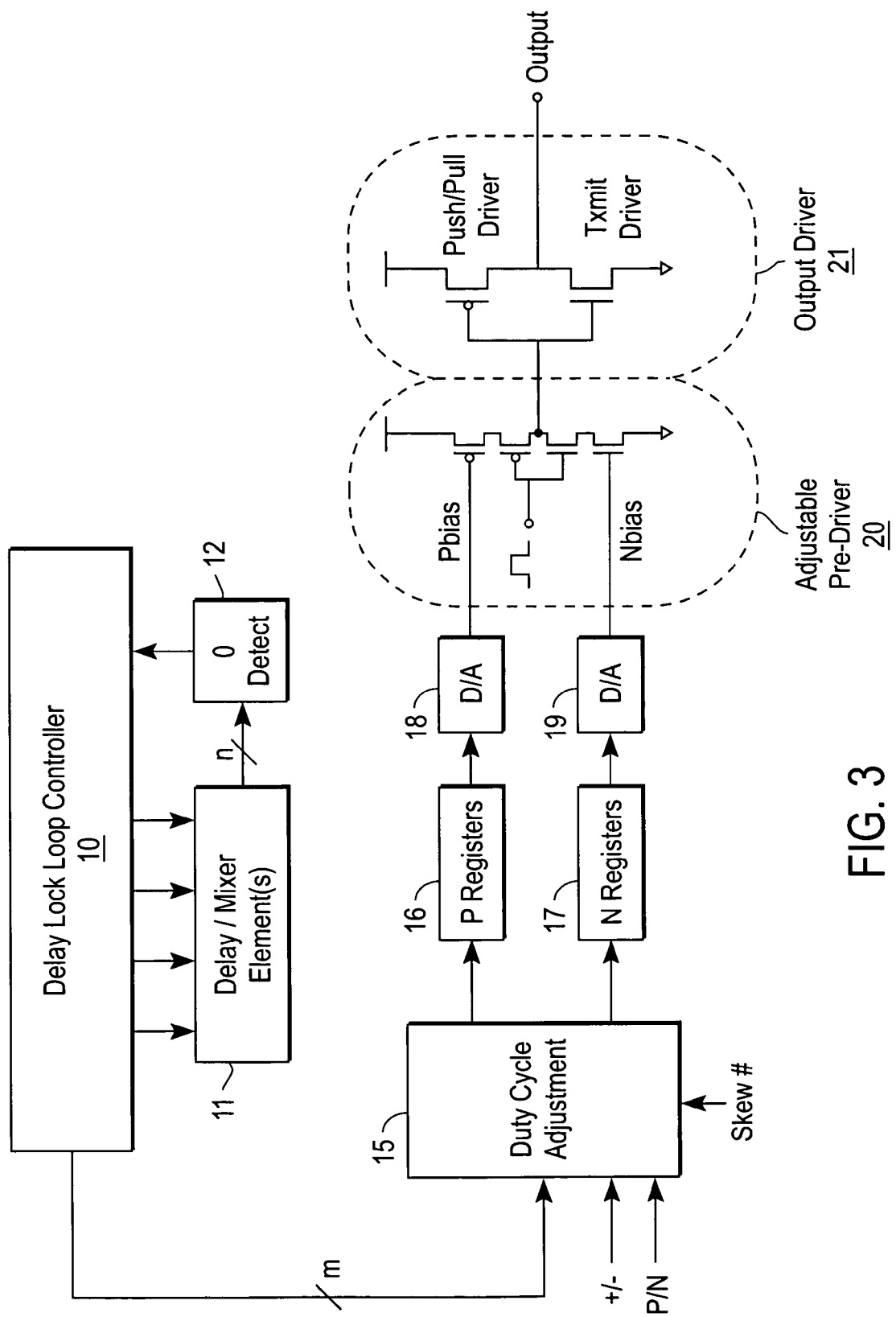
FIG. 3 conceptually illustrates a relationship between the push-pull driver of the present invention in relation to Delay Lock Loop controller and associated circuitry.

Consider, for example, the relationships shown in FIG. 3. One of ordinary skill in the art will recognize that much extraneous detail has been omitted from the diagram for purposes of illustration. A Delay Lock Loop Controller 10 may be resident on a master controller of the bus system (not shown) or in one or more bus system slave elements (not shown). For example, assuming a DDR memory system as a working environment, DLL 10 might be resident in a memory system controller or in one or more memory elements, such as dynamic random access memory (DRAM) elements. Alternatively, the control signals illustrated hereafter in relation to DLL 10 may be provided by a master clock circuit, or a similar phase controlled reference signal generator. Whatever the actual source of the control signals (or codes), it is important that the signals serve as an effective process detector relative to the fabrication process (es), and/or temperature and voltage conditions affecting performance of the output transistors in the push-pull driver. Use of a DLL in the present example is preferred since data transmission elements in contemporary bus systems are increasing associated with resident DLL(s) or PLL(s).

Returning to the example shown in FIG. 3, DLL 10 cooperates with a series of delay or mixer elements 11 to generate "n" reference signals applied to phase ($\Phi$) detector 12. Phase detector 12 generates a feedback signal which when applied to DLL 10 allows DLL 10 to generate "m" digital control codes using conventional techniques. The use of digital control codes, as opposed to analog control signals, is presently preferred since digital codes are easily stored and readily passed between circuit block elements on one or more printed circuit boards.

The particular delay/mixer element 11 (or one or more component(s) therein) selected in DLL 10 should be carefully chosen to match the PVT performance characteristics of the pre-driver circuit and/or the output drivers. In the present example, an RC type delay element is selected. The R component of the delay element is typically a PMOS device used as a load resistor. As such, this component matches the behavior of the dominant PMOS component in the pre-driver which is used as an impedance to limit the pre-driver current which will control the slew rate of the edge of voltage waveform output by the driver, as defined by the known relationship of $dv/dt=I/C$, where "I" is the control limited current and "C" is the gate capacitance of the driver.

In other words, both the PMOS load in a selected DLL delay element and the PMOS load in the pre-driver circuit use a similarly scheme to provide gate voltage biasing. Hence, the performance of these two elements track one another very well over a range of PVT conditions. Similar "PVT tracking" relationships may be identified, such as the C component in the selected DLL delay element as compared with the gate-drain capacitors of the open-drain NMOS output driver. One of ordinary skill in the art will readily appreciate that such PVT tracking relationships are many and varied according to the actual nature of the "process detector" selected and the design of the pre-driver/output driver circuit. Hereafter, the PVT related elements, i.e., one or more elements in the process detector and one or more elements in the push-pull driver, will be referred to as "Reference Element(s)."

While shoot-through is under closed loop control in the present invention, the driver slew rate is being controlled by the DLL (process detector) to ensure constant and predictable slew rate. As described, the pre-driver Reference Element will track, over changes in PVT, the performance of the DLL Reference Element. This is true over a range of operating frequencies. More specifically, the DLL is locked via a closed feedback loop to a particular operating frequency. Since the DLL Reference Element exhibits certain performance characteristics at this known operating frequency, any changes in performance due to PVT will be accurately reflected as a function of the operating frequency. Thus, in effect, the feedback locking mechanism of the DLL provides precise information regarding PVT and operating frequency. When reflected by the resulting DLL control codes this information may be utilized to accurately control the slew rate of the output signal. In this manner, the pre-driver Reference Element can be made to track not only PVT, but also operating frequency.

In the working example, "m" digital control codes are derived from DLL 10 and transmitted to a duty cycle adjustment circuit 15. The control codes are stored in duty cycle adjustment circuit 15, but may also be separately stored in association with one or more push-pull driver circuits. As conceptually illustrated in FIG. 3, control codes stored in duty cycle adjustment circuit 15 may be selected (P verses N) by a selection signal P/N. More importantly, the control codes are modified to optimize the switching of the output drive transistors. Modification may be made by means of an add/subtract signal (+/−) and/or a skew # adjustment signal. Each of these modifying signals may be derived from the closed loop feedback described below. Once modified the control codes may be written to control code registers 16, 17 and subsequently applied through digital-to-analog conversion circuits 18, 19 to pre-driver circuit 20.

With the foregoing relationships and concepts in mind, an exemplary approach to closed loop control of shoot-through and DLL tracking of the slew rate in a push-pull driver will be described. In this approach, a non-overlap threshold is determined and PIN control codes are periodically dithered around this threshold to detect performance drift in the push-pull driver. In other words, by inducing some allowable shoot-through during the switching transition of a push-pull driver, one may accurately detect the non-overlap threshold. Further, one may thereafter control shoot-through by generating and manipulating control signals that define the period of non-overlap during the P/N hand-off of the push-pull output drivers, thereby ensuring a clean break before make condition.

Figure 8:
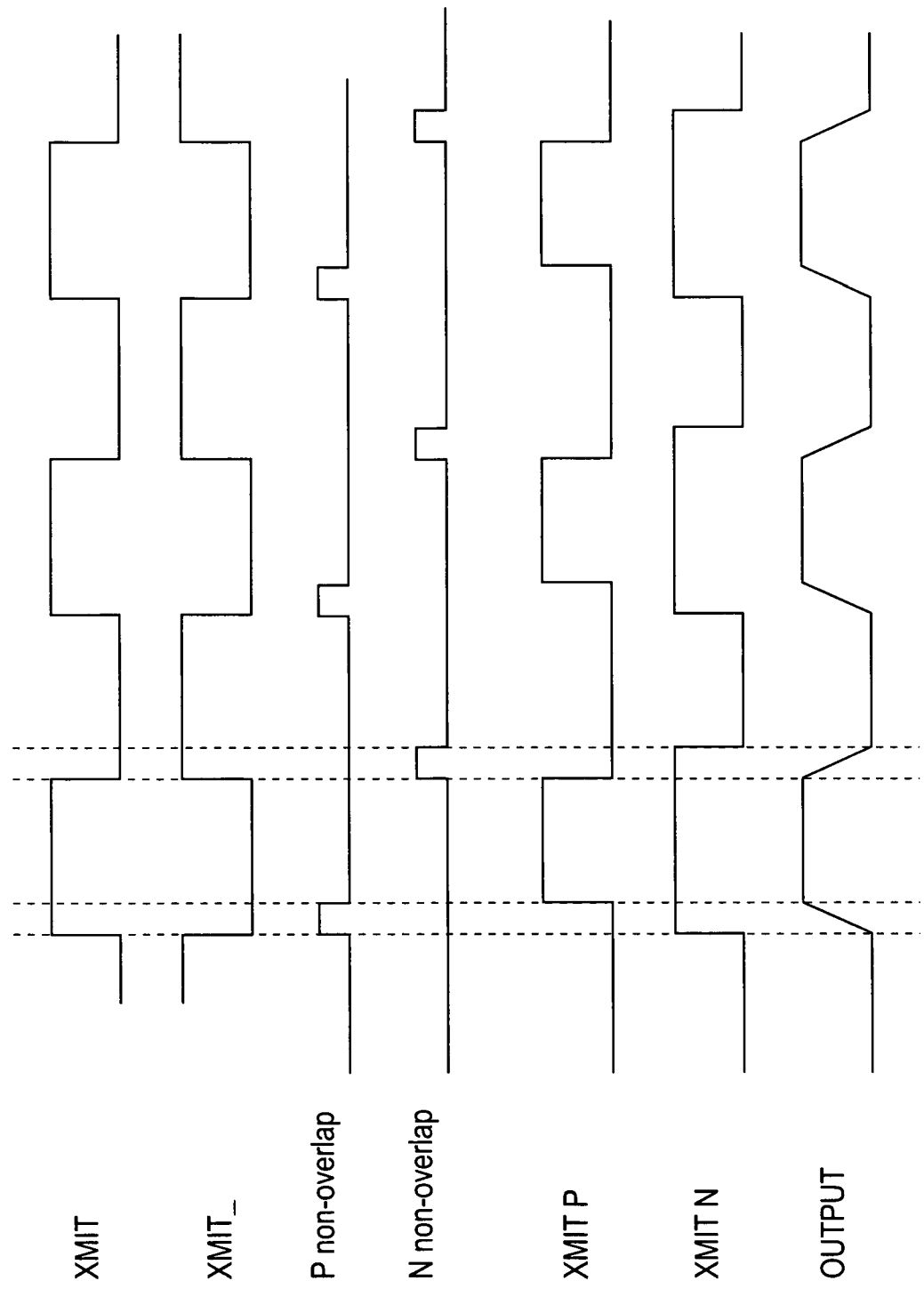
FIG. 8 is a timing diagram illustrating control and output waveform relationships for one embodiment of the present invention; and, FIGS. 9, 10, and 11 are related circuit diagrams illustrating certain sections of a closed-loop push-pull driver circuit according to the present invention.

Before turning to an exemplary circuit, several timing relationships and concepts should be understood. Referring to FIG. 8, the present invention provides two, non-overlapping transmission signals, namely XMIT P and XMIT N. These transmission signals are defined in relation to a selected Reference Element (a delay cell as per the previous discussion) in the DLL so that any timing signal thus derived will accurately reflect PVT and operating frequency. A master transmission clock (fixed frequency) signal XMIT and its complement XMIT_ are applied to the DLL as references. A P non-overlap signal and a N non-overlap signal are defined, respectively, in relation to the rising and falling edges of the master clock signal. Using the relationships between the P non-overlap and N non-overlap signals and the master clock, XMIT P and XMIT N are defined.

Of note, the Reference Element in the process detector will have a fixed temporal relationship with the master transmission clock signal with respect to the effects of PVT. Further, the DLL Reference Element will have a frequency tracking limit. Transmission timing may be further skewed or adjusted in the alternative to or in addition to the PVT and frequency tracking derived from the DLL Reference Element. That is, the control codes provided from the DLL may be further manipulated in a closed loop environment to define (adjust) non-overlap signal timing to minimize shoot-through in a system where pre-driver performance set to a fixed default value related to the performance of the DLL Reference Element. Alternatively, where the non-overlap signal timing is fixed, the size (or strength) of the pre-driver elements may be adjusted to properly match the timing criteria.

Turning now to the exemplary circuit shown in FIG. 9, the development of feedback sensing points will be described. During fabrication of the push-pull driver, transistors P0a and N0a are respectively formed with scaled down relationships to transistors P0 and N0. As such, the path between the voltage source (Vs) and ground running through P0a and N0a will conduct current having the same characteristics as the parallel current path through the driver transistors P0 and N0. Thus, shoot-through current in the drive path will be mirrored in the pre-driver current path. Further, since P0a and N0a are formed under the same fabrication processes as P0 and N0 and since P0a and N0a operate under the same voltage and temperature conditions as P0 and N0, the "driver mirror" current path will respond with similar PVT characteristics as the output driver current path. Thus, performance information (skew, drift, shoot-through, etc.) from the driver mirror may be used as a feedback signal to adjust the switching drive signals (XMIT P and XMIT N).

In the present example, drain currents p0ad and n0ad are converted to control voltages by resistors R0 and R1. In the process of converting the driver mirror current to driver mirror control voltages, the current may by gained up to exaggerate the shoot-through crossing point. The region (or period) of shoot-through is essentially defined as the amount of time that both the PMOS and NMOS drivers are ON. This region is derived (or identified) by exclusive-ORing the drain signals of the sense transistors P0a and N0a, i.e., signals p0ad and n0ad. If no shoot-through occurs, the midpoint of the two sense resistors (R0 and R1) will swing from rail to rail instantaneously. If, however, shoot-through occurs, then, for example, the drain of the NMOS sense transistor N0a would be at ground, but current would yet pass through the associated sense resistor. The resulting voltage would create a "high" signal level at the drain of the PMOS sense transistor P0a. Thus, in the example shown FIG. 9, the driver mirror control voltages are applied to an exclusive OR gate (XOR gate) formed by the combination of elements U5, U6, U21, U22, U26 and U27. As the XOR gate is used to detect the shoot-through crossing region, it will generate a shoot-through flag when a certain level of shoot-through is present in the output current path. The sensitivity of the XOR gate to shoot-through may be defined by the designer in relation to an expected range of potential shoot-through current, the tolerance of the bus system to shoot-through. Once defined the current feedback ratio and the size of the sense resistors can be determined.

In operation the output of the XOR gate sets the respective SR latches 110 and 111 with signals stP or stN. See FIG. 11. After a shoot-through detection update is complete, the up/down count asserted, and the digital count of the "copy of the Reference delay element is updated, control logic 112 transmits a Reset to SR latches 110 and 111 to prepare the latches for the next shoot-through detection cycle. An output by either one of the SR latches 110 and 111 in response to the XOR gate outputs produces a pumpup signal which is applied to the duty cycle adjustment circuit 15 shown in FIG. 3. As discussed above, the duty cycle adjustment circuit 15 is a generic arithmetic logic unit (ALU) that is capable of receiving digital control codes from the process detector (DLL 10) and digitally manipulating these codes.

Figure 11:
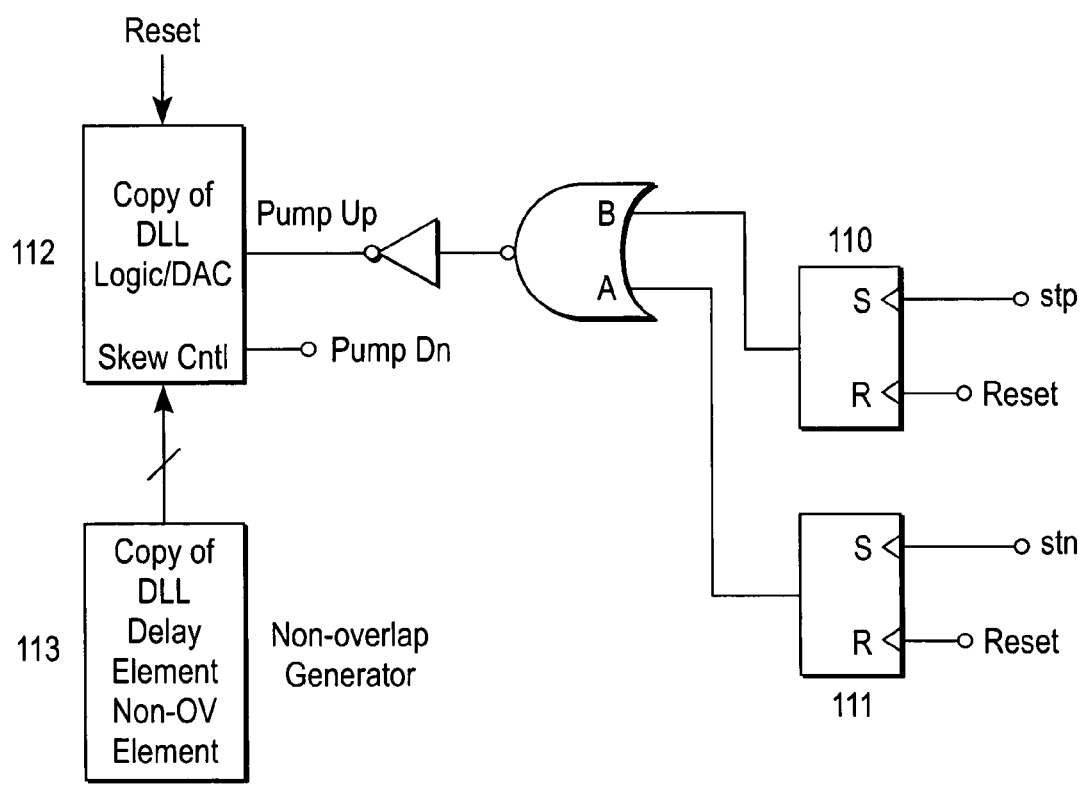

Separate control logic, found for example in the controller (not shown) periodically provides a pumpdn signal to logic block 112 in FIG. 11. The pumpdn signal is designed to provoke a modest shoot-though violation. The object here is to create a controlled dither across the switching signal (XMIT P and XMIT N) timing boundary, such that shoot-through is induced (at some minimal level) by the pumpdn signal, and then ended by operation of the feedback loop developing the pumpup signal. Thus, a feedback signal is derived from the Reference Element in the process detector. That is, digital control codes from the process detector are modified in relation to information contained in the driver mirror circuit.

Figure 9:
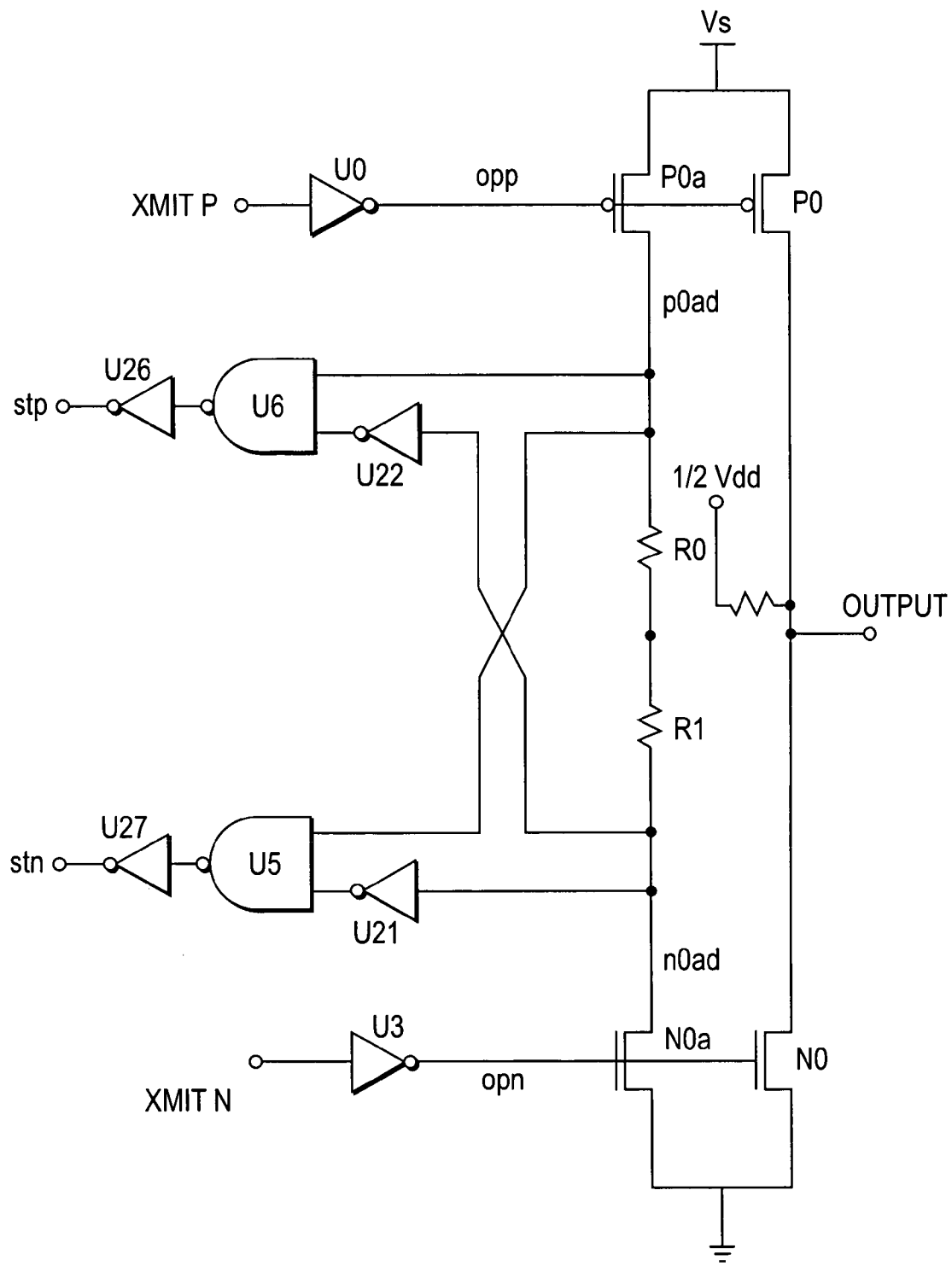
Figure 10:
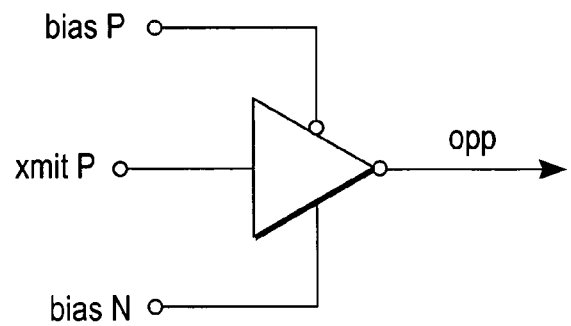

As one design alternative, the oop and opn drive signals respectively applied to P0a and N0a in FIG. 9 may be derived from the circuit shown in FIG. 10. Here, the respective XMIT signal is adjusted using a P bias and N bias. These bias signals are preferably derived from the DLL control codes discussed previously. See, FIG. 3. D to A converters 18 and 19 in FIG. 3 convert the stored digital cods into analog control signals by means of a binary weighted resistor divider. The P and N bias signals adjust (or limit) the current of the pre-driver. This approach ensures that the pre-driver strength will yield a constant slew rate because the DLL code accurately reflects the PVT and operating frequency information.

The foregoing examples thus illustrate two closed-loop control approaches to correcting shoot-through in a push-pull driver circuit. Both of these approaches use reference information derived from process detector, such as a DLL, to provide improved push-pull switching across a range of PVT conditions. Where such reference information is expressed as digital codes, the code may be manipulated by the closed feedback loop to either (1) to adjust non-overlap timing for the PMOS and NMOS output drivers to minimize shoot-through in a bus system in which the pre-driver strength is fixed to a default value tracking the DLL, or (2) to adjust the pre-driver strength to match the non-overlap timing criteria in bus systems where the non-overlap signal timing is fixed.

What is claimed is:

1. A driver circuit, comprising:
   a first transistor having a source electrode and a drain electrode, the first transistor to source a current to an output terminal, wherein the source electrode of the first transistor is coupled to ground and the drain electrode in the first transistor is coupled to the output terminal;
   a second transistor having a source electrode and a drain electrode, the second transistor to sink a current from the output terminal, wherein the source electrode of the second transistor is coupled to a voltage source and wherein the drain electrode in the second transistor is coupled to the output terminal;
   a third transistor for pre-driving the first transistor in response to a signal applied to the third transistor through a drive signal path, wherein the drive signal path has a first delay; and
   a first circuit for defining a non-overlap signal path for the signal applied to the third transistor, wherein the non-overlap signal path has a second delay, and wherein the second delay is less than the first delay.

2. The driver circuit of claim 1, wherein the first circuit limits shoot-through in a current path coupled to the output terminal in accordance with the first delay and the second delay.

3. The driver circuit of claim 1, wherein switching signals for the driver circuit are actively tuned using a closed feedback loop.

4. The driver circuit of claim 3, wherein active tuning of the switching signals adjusts for variations in fabrication processes for the driver circuit, operating temperature and operating voltage.

5. The driver circuit of claim 3, wherein the closed feedback loop is based on a timing relationship provided by a delay locked loop.

6. The driver circuit of claim 1, further comprising:
   a second circuit defining a boot-strap signal path for the signal being applied to the third transistor, wherein the second circuit has a third delay through the boot-strap signal path, and wherein the third delay is greater than the second delay and is less than the first delay.

7. The driver circuit of claim 6, wherein the second circuit comprises:
   a gate receiving an output voltage at the output terminal and generating a charge pump enable signal; and
   a third circuit applying charge to the third transistor in response to the charge pump enable signal.

8. The driver circuit of claim 7, wherein the third circuit comprises a positive feedback loop.

9. The driver circuit of claim 6, wherein the second circuit only boosts a portion of an output signal transition edge.

10. The driver circuit of claim 1, further comprising a second circuit for disabling the second transistor.

11. A driver circuit, comprising:
    a first transistor having a source electrode and a drain electrode, the source electrode connected to a voltage source and the drain electrode connected to an output terminal;
    a second transistor having a source electrode and a drain electrode, the source electrode connected to ground and the drain electrode connected to the output terminal; and
    a first circuit having a first signal path,
    wherein the first circuit is operable in one of two modes, a first mode and a second mode, the first mode applying a signal to the first transistor and the second transistor to form a push-pull driver circuit, the signal having a first delay through the first signal path, and the second mode applying the signal to a boot-strap circuit and the second transistor to form an open-drain driver circuit.

12. A driver circuit, comprising:
    a first transistor having a source electrode and a drain electrode, the source electrode connected to a voltage source and the drain electrode connected to an output terminal;
    a second transistor having a source electrode and a drain electrode, the source electrode connected to ground and the drain electrode connected to the output terminal;
    a first circuit having a first signal path;
    a second circuit having a second signal path and a corresponding second delay, wherein the second circuit increases a transition edge of an output signal in the first mode of operation and in the second mode of operation; and
    a third circuit,
    wherein the first circuit is operable in one of two modes, a first mode and a second mode, the first mode applying a signal to the first transistor and the second transistor to form a push-pull driver circuit, the signal having a first delay through the first signal path, and the second mode applying the signal to the second transistor to form an open-drain driver circuit; and
    wherein the third circuit is enabled in the first mode of operation to define a third signal path for the signal applied to the first transistor and the second transistor, the third signal path comprising a non-overlapped signal path and having a third delay, and wherein the third circuit is disabled in the second mode of operation.

13. The driver circuit of claim 12, wherein in the first mode the third circuit limits shoot-through in a current path coupled to the output terminal in accordance with the first delay and the second delay.

14. The driver circuit of claim 12, wherein switching signals for the output driver are actively tuned in the first mode of operation using a closed feedback loop.

15. The driver circuit of claim 14, wherein active tuning of the switching signals adjusts for variations in fabrication processes for the driver circuit, operating temperature and operating voltage.

16. The driver circuit of claim 14, wherein the closed feedback loop is based on a timing relationship provided by a delay locked loop.

17. The driver circuit of claim 12, wherein the third delay is less than the first delay.

18. The driver circuit of claim 12, wherein the second delay is greater than the third delay and less than the first delay.

19. The driver circuit of claim 12, wherein the second circuit only increases a portion of the transition edge of the output signal.

20. A method of selecting a mode of operation in a driver circuit, comprising:
   applying a control signal to a circuit to select a respective mode of operation of the driver circuit,
   wherein in a first mode of operation the circuit applies a signal to two transistors to form a push-pull driver circuit, and wherein in a second mode of operation the circuit applies the signal to a boot-strap circuit and one transistor to form an open-drain driver circuit.

* * * * *